United States Patent
Bhaskaran et al.

(10) Patent No.: US 9,823,538 B2
(45) Date of Patent: Nov. 21, 2017

(54) DISPLAY DEVICE BASED ON PHASE-CHANGE MATERIALS

(71) Applicant: OXFORD UNIVERSITY INNOVATION LIMITED, Oxford (GB)

(72) Inventors: Harish Bhaskaran, Oxford (GB); Peiman Hosseini, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 15/107,164

(22) PCT Filed: Dec. 22, 2014

(86) PCT No.: PCT/GB2014/053825
§ 371 (c)(1),
(2) Date: Jun. 22, 2016

(87) PCT Pub. No.: WO2015/097468
PCT Pub. Date: Jul. 2, 2015

(65) Prior Publication Data
US 2017/0031231 A1   Feb. 2, 2017

(30) Foreign Application Priority Data

Dec. 23, 2013  (GB) .................................. 1322917.4
Oct. 10, 2014  (GB) .................................. 1417974.1

(51) Int. Cl.
*G02F 1/01* (2006.01)
*G02F 1/19* (2006.01)
(Continued)

(52) U.S. Cl.
CPC ........... *G02F 1/19* (2013.01); *G02B 27/2278* (2013.01); *G02F 1/0105* (2013.01);
(Continued)

(58) Field of Classification Search
CPC ........ G02F 1/01; G02F 1/0105; G02F 1/0107; G02F 1/0147; G02F 1/1508; G02F 1/19;
(Continued)

(56) References Cited

U.S. PATENT DOCUMENTS 3,460,884 A * 8/1969 Heller ..................... G02F 1/174
359/315
3,496,429 A * 2/1970 Robinson ............ H01L 33/0062
148/DIG. 56

(Continued)

FOREIGN PATENT DOCUMENTS

JP   2009-086060 A   4/2009

OTHER PUBLICATIONS

Kats, Mikhail A. et al. "Nanometre Optical Coatings Based on Strong Interference Effects in Highly Absorbing Media" Letters—Nature Materials; vol. 12; Jan. 2013.
(Continued)

*Primary Examiner* — Loha Ben
(74) *Attorney, Agent, or Firm* — Jason H. Vick; Sheridan Ross, PC

(57) ABSTRACT

A display device comprises a plurality of pixels, each pixel having a portion (10) of a solid-state, phase-change material such as germanium-antimonium-telluride (GST) or vanadium dioxide, wherein the phase-change material can be reversibly brought into an amorphous state or a crystaline state and has a refractive index that is reversibly, electrically controllable. A plurality of electrodes (14, 16) are provided, at least two of which contact said portion of material (10). A controller (19) is provided that is adapted to apply at least one voltage to said material (10), via said electrodes (14, 16), to change said refractive index. An array of such
(Continued)

portions of material can be arranged to make a pixellated display, for example a stereoscopic display of the volumetric type.

16 Claims, 6 Drawing Sheets

(51) Int. Cl.
*G02B 27/22* (2006.01)
*H01L 45/00* (2006.01)

(52) U.S. Cl.
CPC .......... *G02F 1/0107* (2013.01); *G02F 1/0147* (2013.01); *G02F 2203/34* (2013.01); *H01L 45/06* (2013.01)

(58) Field of Classification Search
CPC . G02F 2203/34; G02B 27/2278; H01L 45/06; B82Y 20/00
USPC ........ 359/240, 245, 259, 263, 279; 353/6, 7; 250/214 LA
See application file for complete search history.

(56) References Cited

U.S. PATENT DOCUMENTS

| | | | | |
|---|---|---|---|---|
| 3,515,880 A * | 6/1970 | Letter | ................... | G02F 1/1508 250/214 LA |
| 3,535,598 A * | 10/1970 | Feist | ..................... | B82Y 10/00 257/10 |
| 3,823,998 A * | 7/1974 | Yazaki | .................. | G02F 1/0533 252/583 |
| 3,998,523 A * | 12/1976 | Otomo | .................. | C04B 35/493 353/122 |
| 5,272,359 A * | 12/1993 | Nagasubramanian | . | B82Y 10/00 257/2 |
| 5,347,377 A * | 9/1994 | Revelli, Jr. | ........... | G02F 1/1326 250/227.17 |
| 5,764,317 A | 6/1998 | Sadovnik et al. | | |
| 6,819,469 B1 | 11/2004 | Koba | | |
| 7,262,899 B2 * | 8/2007 | Bigman | .................. | G02F 1/153 359/269 |
| 8,456,514 B2 * | 6/2013 | Leister | ................. | G02B 26/005 348/40 |
| 8,917,440 B2 | 12/2014 | Kim et al. | | |
| 2006/0119774 A1 | 6/2006 | Chen | | |
| 2007/0125997 A1 | 6/2007 | Kim | | |
| 2009/0027758 A1 | 1/2009 | Koshida et al. | | |
| 2011/0149371 A1 | 6/2011 | Liu et al. | | |
| 2013/0043375 A1 | 2/2013 | Baleine et al. | | |
| 2015/0098032 A1 | 4/2015 | Park | | |

OTHER PUBLICATIONS

Kats, Mikhail A. et al., "Ultra-Thin Perfect Absorber Employing a Tunable Phase Change Material" Applied Physics Letters 101, 221101; 2012.

Yamada, Noboru "Origin, Secret, and Application of the Ideal Phase-Change Material GeSbTe" Physica Status Solidi (B), vol. 249, No. 10; pp. 1837-1842; Oct. 1, 2012.

International Search Report and Written Opinion prepared by the European Patent Office dated Feb. 12, 2015, for International Application No. PCT/GB2014/053825.

Noboru Yamada: "Origin, secret, and application of the ideal phase-change material GeSbTe", Physica Status Solidi (B), vol. 249, No. 10, Oct. 1, 2012 (Oct. 1, 2012), pp. 1837-1842.

* cited by examiner

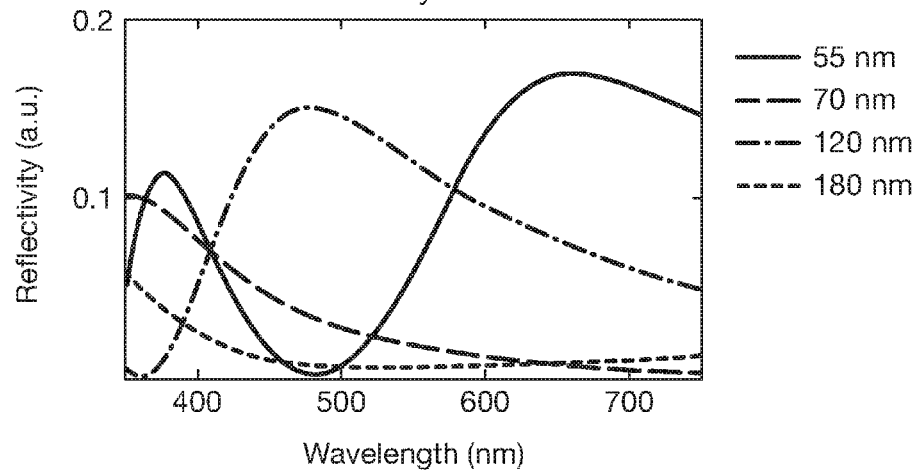
Fig. 3(a) Crystalline
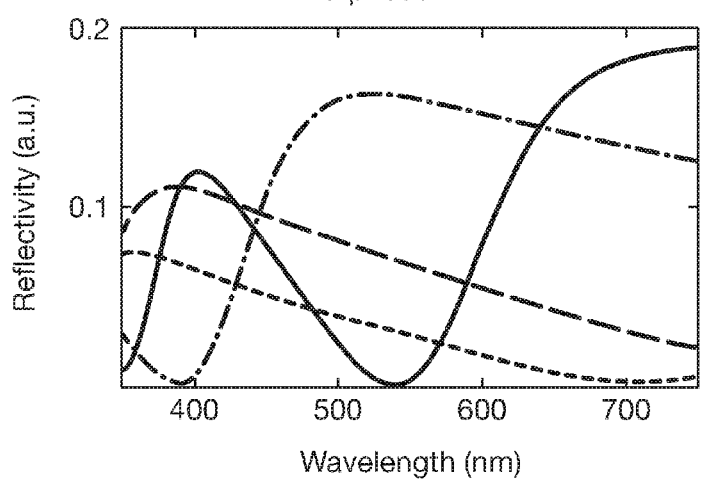
Fig. 3(b) Amorphous

DISPLAY DEVICE BASED ON PHASE-CHANGE MATERIALS

CROSS REFERENCE TO RELATED APPLICATIONS

This application is a national stage application under 35 U.S.C. 371 and claims the benefit of PCT Application No. PCT/GB2014/053825 having an international filing date of 22 Dec. 2014, which designated the United States, which PCT application claimed the benefit of Great Britain Application No. 1322917.4 filed 23 Dec. 2013 and Great Britain Application No. 1417974.1 filed 10 Oct. 2014, the disclosures of each of which are incorporated herein by reference.

The present invention relates to a display device.

There have been considerable developments in display technologies, for example in the field of portable computing and communication devices. Some display technologies, such as back-lit color displays have relatively high power consumption and are complex to make. Different technologies provide non-back-lit black-and-white displays, but have slow switching speeds, so are not capable of displaying video, and, of course lack color. Further technologies require high drive voltages, which are inconvenient to generate, and tend to have a high power consumption. With all of these technologies, there is also the problem of producing high resolution displays.

The present invention has been devised in view of the above problems.

Accordingly, the present invention provides a display device comprising:
a plurality of electrodes;
a portion of solid state material, wherein said material has a refractive index that is reversibly controllable by application of a voltage to said electrodes; and
a controller adapted to apply at least one voltage, via said electrodes, to change said refractive index of said material.

Further optional features of the invention are defined in the dependent claims.

The present invention enables a display device to be fabricated that can operate at high speed, and provide color. The invention provides a display device that can be simple to fabricate and can offer high resolution display. The display device of an embodiment of the invention is compatible with other readily available commercial electronics and industrial technology, and can be fabricated on a variety of substrates, including flexible substrates.

BRIEF DESCRIPTION OF THE DRAWINGS

Embodiments of the invention will now be described, by way of example only, with reference to the accompanying drawings in which:

FIGS. 3(a) and 3(b) are plots of reflectivity against wavelength for several different thicknesses of the transmissive spacer layer of a display element according to an embodiment of the invention, FIG. 3(a) is for the phase change material being in the crystalline phase, and FIG. 3(b) is for the phase change material being in the amorphous phase;

DETAILED DESCRIPTION OF THE PREFERRED EMBODIMENTS

Figure 1:
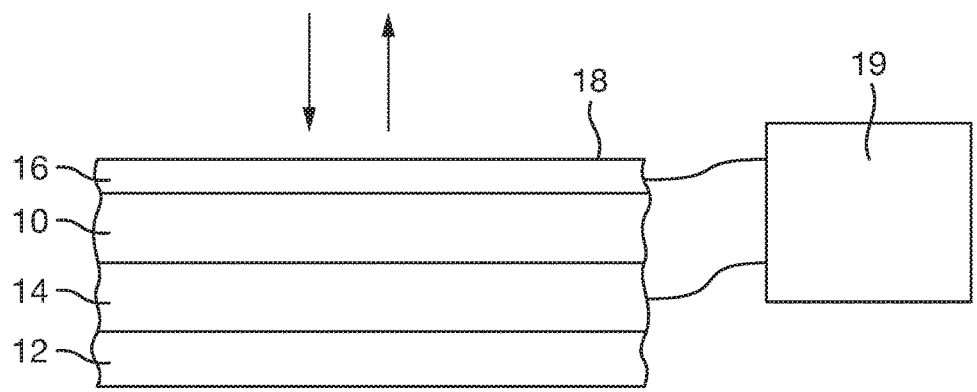
FIG. 1 is a schematic cross-section of a portion of a display device according to an embodiment of the invention.

An embodiment of a display device will be described with reference to FIG. 1, which shows a layered structure in cross-section. A portion of solid state material 10 is provided in the form of a layer. The material of this layer has a refractive index that is permanently, yet reversibly, changeable by the application of an appropriate electrical voltage. Such a material, also known as a phase change material (PCM), undergoes a drastic change in both the real and imaginary refractive index when switched between amorphous and crystalline phases. In the present preferred embodiment, the material is $Ge_2Sb_2Te_5$ (GST).

The portion of material 10 is provided on a reflector 12, which in this embodiment is a layer of metal such as platinum or aluminium. A spacer layer 14 is sandwiched between the material 10 and the reflector 12. A capping layer 16 is provided on top of the material layer 10. In this particular embodiment, the upper surface 18 of the capping layer 16 constitutes the viewing surface of the display device, and the reflector 12 is the back-reflector. Light enters and leaves through the viewing surface 18, as indicated by the arrows in FIG. 1. However, because of interference effects dependent on the refractive index of the material layer 10 and the thickness of the spacer 14, the reflectivity varies significantly as a function of wavelengths of light, as will be illustrated further below.

The spacer 14 and the capping layer 16 are both optically transmissive, and are ideally as transparent as possible. In this embodiment, the spacer 14 and capping layer 16 also have the dual function of being electrodes for use in applying a voltage to the material layer 10 which is sandwiched between these electrodes. Therefore, the spacer 14 and the capping layer 16 are made of a transparent, electrically conductive, material such as indium tin oxide (ITO).

The whole structure showing in FIG. 1 can be provided on a substrate (not shown) such as a semiconductor wafer, $SiO_2$, or a flexible substrate such as a polymer film. The layers are deposited using sputtering, which can be performed at a relatively low temperature of 100 Celsius. The layers can also be patterned as required, using conventional techniques known from lithography, or other techniques e.g. from printing. Additional layers may also be provided for the device as necessary.

In the preferred embodiment, the material layer 10, composed of GST, is less than 100 nm thick, and preferably less than 10 nm thick, such as 6 or 7 nm thick. The spacer layer 14 is grown to have a thickness typically in the range from 10 nm to 250 nm, depending on the color and optical properties required, as discussed below. The capping layer 16 is, for example, 20 nm thick.

Figure 2:
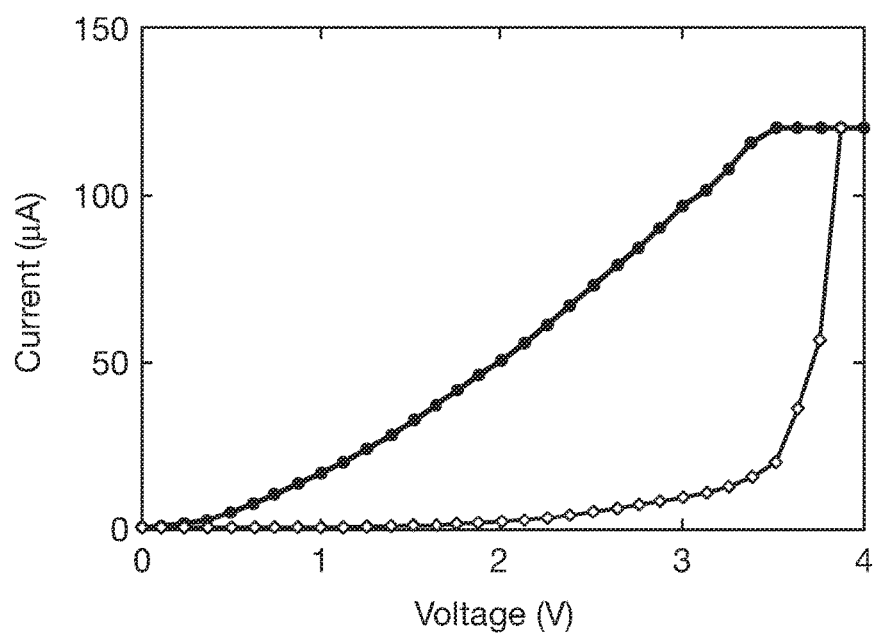
FIG. 2 is a graph of the current-voltage characteristics of a phase change material used in an embodiment of the invention.

The material of the layer 10, in this embodiment GST, can undergo an electrically induced reversible phase change. It is deposited in the amorphous state. FIG. 2 shows the electrical characteristics of a film of this material. The lower curve corresponds to the amorphous state, with a relatively high resistance. When the applied voltage reaches a threshold voltage of about 3.5 V, an electronic transition occurs that allows a much greater current to flow, which generates heating and crystallizes the material. (In the example of FIG. 2, the maximum current is limited to 120 micro Amps in order to protect the device from damage from the sudden rush of current after the threshold event.) When the voltage is then reduced, the current characteristic follows the upper line, the gradient of which shows that the conductance of the crystalline phase is around 350 times greater than that of the amorphous phase. The material is now indefinitely stable in the crystalline phase under ambient conditions. To switch back to the amorphous state, a higher voltage, such as 5 V, is applied that melts the material and, if the voltage is removed sufficiently rapidly, the material freezes back into the amorphous phase.

As previously explained, there is a substantial change in the refractive index when the material is switched between amorphous and crystalline phases. The material is stable in either state. This means that the voltage can be entirely removed when the display is in a steady-state (not being switched), so the power consumption of the device is low. Switching can be performed an effectively limitless number of times. The switching speed is also very rapid, typically less than 300 ns, and certainly several orders faster than the human eye can perceive.

A controller 19 (schematically depicted in FIG. 1) is provided to apply the required voltages for the necessary durations to switch the material layer 10 of the device of FIG. 1 between amorphous and crystalline phases having different specific refractive indices, and vice versa. The controller can comprise specific electronic circuitry driven by a microprocessor. Some or all of the circuitry of the controller can be provided integrated onto a substrate with the optical layers of FIG. 1, or can be provided as separate dedicated circuitry.

FIGS. 3(a) and (b) show the optical response of the device of FIG. 1. For a particular thickness of the spacer layer 14, FIGS. 3(a) and 3(b) show how switching between the crystalline and the amorphous states modifies the reflectivity as a function of wavelength of incident light. FIGS. 3(a) and 3(b) also show how using different thicknesses of the spacer layer 14 influence the positions of the peeks and troughs of the reflectivity as a function of wavelength.

Thus, on viewing the device of FIG. 1, it appears to have a particular color, and various colors are readily obtained by choosing the thickness of the spacer layer 14. The apparent color of the device can be made to change by switching the material layer 10 between amorphous and crystalline states.

Figure 4:
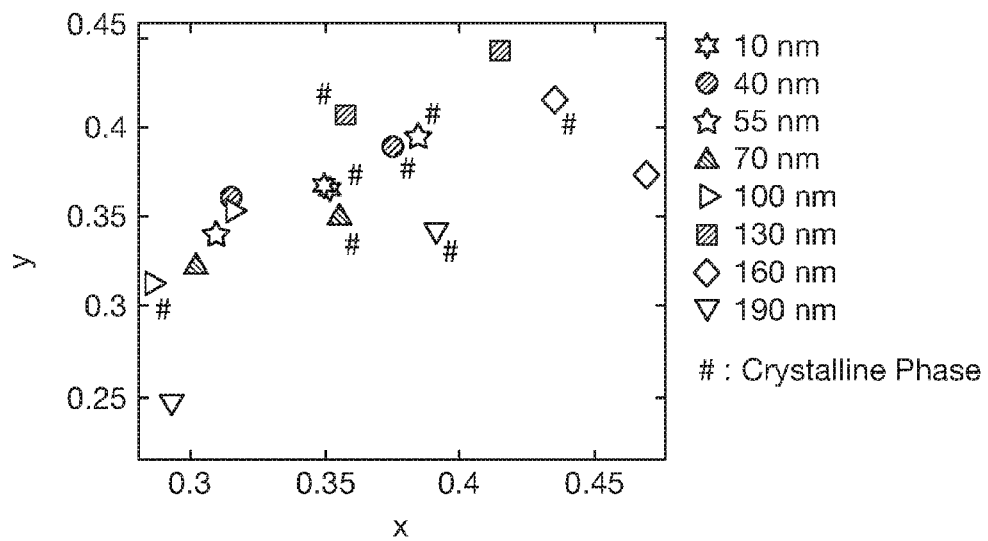
FIG. 4 is a plot of the CIE color space showing the color of a display element of a display device according to an embodiment of the invention, for a range of different thicknesses of the spacer layer, and for both the amorphous phase and a crystalline phase of the solid state phase change material.

Another way of presenting these results is illustrated in FIG. 4. FIG. 4 shows a portion of the CIE color space and plots the xy color coordinates of the apparent color of the device in that color space for a two-degree observer and a D50 illuminator. Each fabricated thickness of the spacer layer 14 is shown by the symbols in the key on the right hand side of FIG. 4. For each symbol there are two points plotted in the color space corresponding to the material layer 10 being in the crystalline phase (indicated by a # adjacent to the symbol), and being in the amorphous phase (symbol without a #). As can be seen, a wide range of colors can be produced depending on the selected thickness of the spacer layer 14. Also, a significant change in perceived color can be achieved in most cases by switching between the two phases of the material layer 10.

Figure 5:
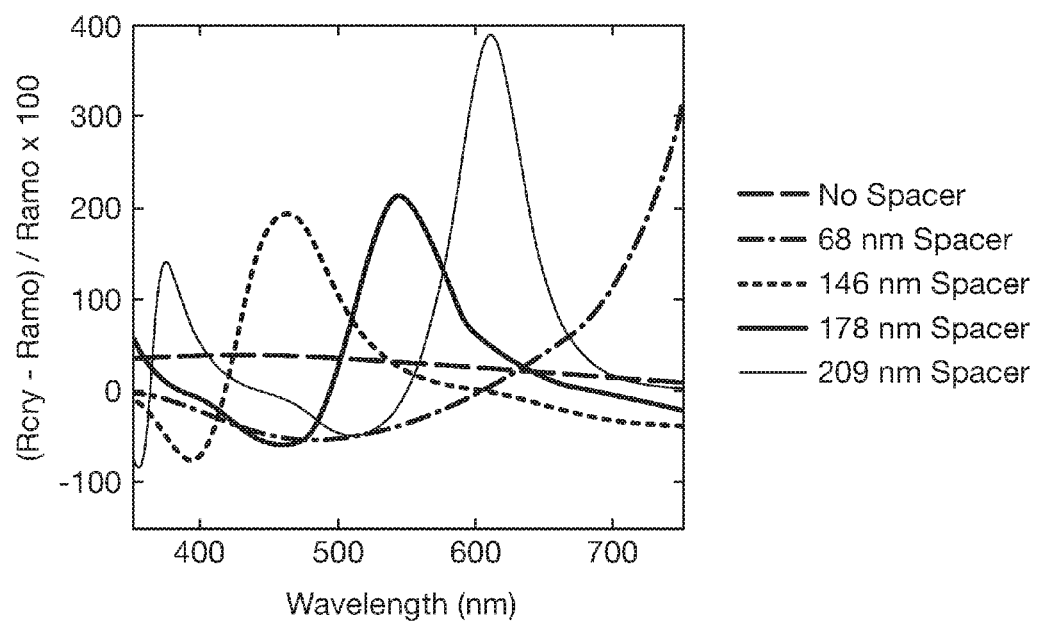
FIG. 5 is a plot of the percentage change in optical reflectivity against wavelength of an element of a display device according to an embodiment of the invention, for several different spacer layer thicknesses.

FIG. 5 shows the percentage change in optical reflectivity between the crystalline and amorphous states of the layer 10, (Rcry−Ramo)×100/Ramo, where Rcry and Ramo are the reflectivites of the device when the material layer 10 is in the crystalline and amorphous states, respectively. The plots are spectra and show the response for a number of different thicknesses of the spacer layer 14. As can be seen, very large modulation in the reflectivity can be obtained at particular wavelengths, selectable by the choice of thickness of the spacer layer 14.

In this way, the display device of FIG. 1 can be made to appear a uniform color, which can then be switched to appear a contrasting color, or to appear much darker or lighter by changing the reflectivity. In one form of a display device, many structures such as that of FIG. 1 are fabricated adjacent to each other in an array, with each structure being individually electrically controllable and constituting a pixel of the overall display. In a further variant, each pixel can comprise a cluster of several structures such as that of FIG. 1 adjacent to each other, but with each structure within the cluster having a different thickness of the spacer layer 14. In this way, each structure within the cluster can switch between different colors, and the pixel comprising the cluster can be made to appear a wide range of different colors within the color space, and not just switch between two color co-ordinates. The number of individual structures of different thicknesses within the cluster comprising a pixel could be three or even more. The controller is provided with a transformation to map between one set of color coordinates, such as RGB, and the necessary switched states of the structures within that cluster forming the pixel, so that color images can readily be displayed.

A further enhanced embodiment is that the material of the layer 10 does not have to be switched simply between a fully crystalline and a fully amorphous state. A mixture of phases can be achieved, such as 20% crystalline, 40% crystalline etc. Partial crystallisation is achieved by simply limiting the maximum current allowed during a switching event (e.g. using a variable resistor in series with one of the electrodes connected to the device). The resulting effective refractive index of the material is somewhere between the two extremes of fully crystalline and fully amorphous depending on the degree of partial crystallisation. Typically between 4 and 8 distinct mixed phases are achievable, but with appropriate control, can be much higher, such as 128 values, and effectively a continuum of refractive index values can be achieved, corresponding to tracing a path through color space.

Figure 6:
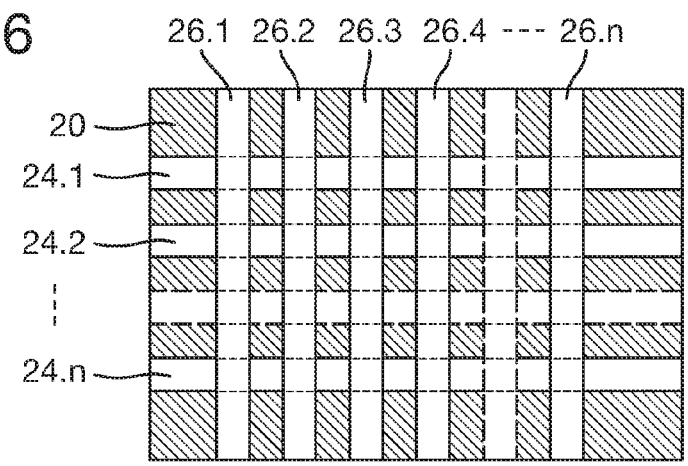
FIG. 6 is a schematic illustration, in plan view, of the arrangement of electrodes for an array of pixels of a display device according to an embodiment of the invention.

FIG. 6 shows, in plan-view, an arrangement of electrodes for a display device according to an embodiment of the invention. A substrate 20 is provided, in or on which a reflector is fabricated for each pixel. Next a plurality of horizontal electrodes 24.1, 24.2, . . . , 24.n, are fabricated.

These electrodes also constitute the spacer layer 14. The solid-state phase change material layer is deposited and patterned. Then the series of vertical electrodes 26.1, 26.1, . . . 26.n, are fabricated. The reflectors and phase change material layer are patterned such that they are only present at each of the intersections of the horizontal and vertical electrodes. All of the fabricating, depositing and patterning can be performed using well-known lithographic techniques.

Each intersection of the horizontal and vertical electrodes now constitutes a stack-like structure as shown in FIG. 1, that comprises an individually electrically controllable pixel. During fabrication, the thickness of the spacer layer/horizontal (bottom) electrode can be separately defined (by lithography) such that each pixel controls a specific range of colors, as explained with reference to FIGS. 3 to 5. By applying an appropriate voltage profile between a horizontal and a vertical electrode, the phase of the material at the pixel at the intersection can be switched as desired. However, the other pixels in the array are not affected, so the addressing of pixels is simple.

Other embodiments of the device can be made in which further electronic components are fabricated in an integrated manner for each pixel to provide what is know in the art as an active matrix.

Further embodiments of display devices will now be explained with reference to FIGS. 7 to 9. The same reference numerals are used for corresponding parts as with the embodiment of FIG. 1, and the description of their material composition and function will be omitted to avoid repetition.

Figure 7:
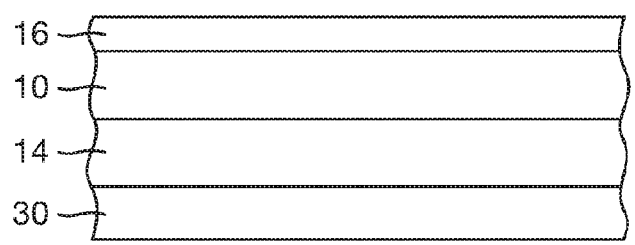
FIG. 7 is a schematic cross-section of a portion of a display according to another embodiment of the invention.

FIG. 7 shows a transmissive display in which the spacer layer 14, phase change material layer 10 and capping layer 16 are provided on transparent or at least partially transmissive substrate 30. Examples of suitable substrates include, quartz ($SiO_2$) and flexible polymer substrates, such as mylar. In this case, the display device can be used in a transmissive mode, and could be provided on items such as glasses, windows or transparent display panels.

Figure 8:
FIG. 8 is a schematic cross-section of a portion of a display according to a further embodiment of the invention.

FIG. 8 illustrates an embodiment of a display device that is effectively a hybrid of FIG. 1 and FIG. 7. It has the usual front layers 16, 10 and 14, as well as the back-reflector 12 plus the transparent layer 30. It can be used as a non-back lit color display when viewed from the viewing surface 18, in the same way as the embodiment of FIG. 1. However, it can also be used in a back-lit display mode. In this embodiment, an additional layer 32 is provided which comprises a back-light illumination source, such as a plurality of LEDs. The light source does not have to be incorporated as a layer in the stack, provided there is a suitable means for introducing the light into the transparent layer 30 to back-light the display.

Figure 9:
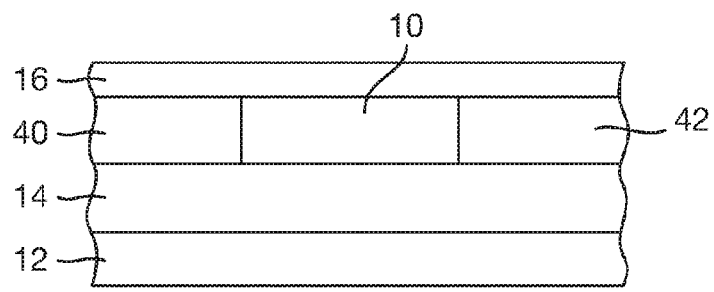
FIG. 9 is a schematic cross-section of a portion of a display according to a yet further embodiment of the invention.

FIG. 9 shows an alternative arrangement for providing electrodes that can be used with any of the preceding embodiments. In this embodiment, the spacer layer 14 and the capping layer 16 are transmissive to light, but are not electrically conductive. Instead, electrodes 40, 42 are fabricated on either side of the material portion 10, and in electrically contact with the phase change material portion 10, such that switching can be achieved by the application of an appropriate voltage between the electrodes 40, 42.

Although some of the embodiments use ITO as the preferred material for the transparent electrodes, this is merely an example, and other suitable materials can be used, such as carbon nanotubes, or a thin layer of metal, such as silver. It is also understood that it is not essential for the electrodes to be transparent when a structure such as that of FIG. 9 is employed, in which case the electrodes 40, 42 can be fabricated from a conductive material, such as tungsten or titanium.

The preceding embodiments have been described with reference to GST ($Ge_2Sb_2Te_5$) as the phase change material of the layer 10, but this is not essential to the invention, and many other suitable materials are available, either separately or in combination, including compounds or alloys of the combinations of elements selected from the following list: GeSbTe, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb. It is also understood that various stoichiometric forms of these materials are possible; for example $Ge_xSb_yTe_z$; and another suitable material is $Ag_3In_4Sb_{76}Te_{17}$ (also known as AIST). Furthermore, the material can comprise one or more dopants, such as C or N.

Although the embodiments described herein mention that the material layer is switchable between two states such as crystalline and amorphous phases, the transformation could be between any two solid phases, including, but not limited to: crystalline to another crystalline or quasi-crystalline phase or vice-versa; amorphous to crystalline or quasi-crystalline/semi-ordered or vice versa, and all forms in between. Embodiments are also not limited to just two states.

The mechanism of switching is not limited to applied electric pulse induced heating, but could be any electromagnetic field induced heating for example a light pulse from a laser or other source, or could be thermal heating for example using electrical resistive heating of an adjacent layer that is in thermal contact with the phase change material.

A further embodiment of an optical device is to provide one or more additional phase change material layers 10 and spacer layers 14 to the previously described structure to create a multilayer stack. By repeating alternating layers, as in this embodiment, the width of the spectral response peak can be reduced to make it more wavelength (color) specific. However, the absorption losses also increase as more layers are added, so the maximum number of phase change material layers is typically two or three.

In the multilayer stack optical device, the thicknesses of each of the layers can be selected separately from each other to engineer desired optical properties. For example, the thickness of each phase change material layer 10 determines the contrast between the different states or phases of the material 10 across the spectrum. Multiple colour combinations (spectra) can be obtained by separately switching/selecting the phase of each material layer. For example, in the case of two phase change material layers, four different apparent colors can be obtained by the combinations: Am-Am; Cry-Am; Am-Cry; and Cry-Cry (where the symbols Am=amorphous, and Cry=crystalline, and the pairs of symbols correspond to the two layers). Each of the multiple layers can be separately switched when appropriate respective electrodes are provided.

Figure 10A:
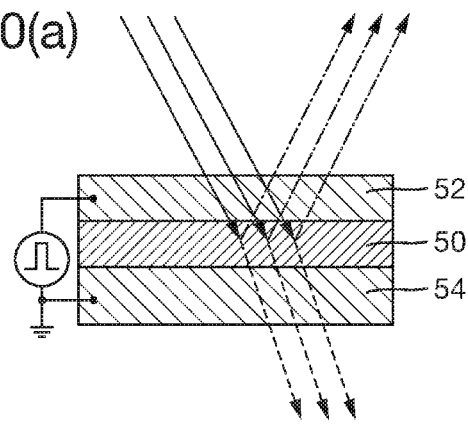
FIGS. 10(a) to 10(e) are schematic cross-sections of a portion of a transmissive filter for a display according to a still further embodiments of the invention.
Figure 10B:
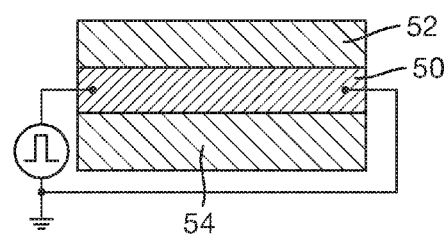
Figure 10C:
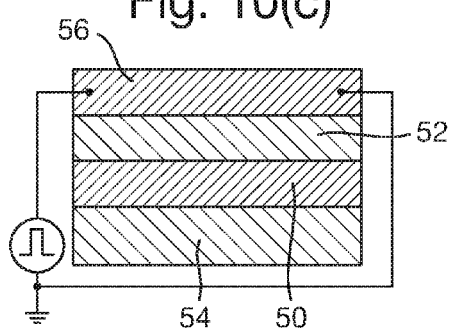
Figure 10D:
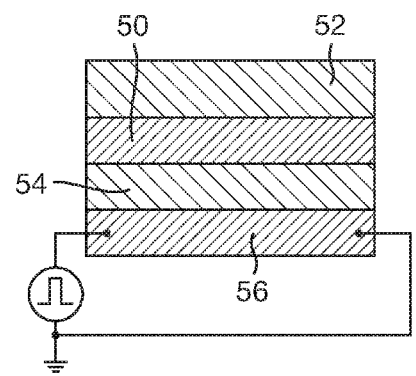
Figure 10E:
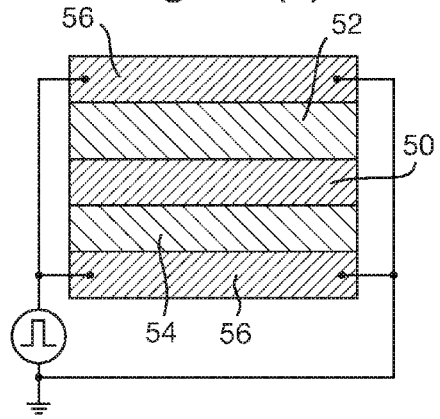

A further embodiment of the invention is similar to FIG. 7 for providing a transmissive display. As shown if FIG. 10(*a*) it comprises a layer 50 of phase change material sandwiched between two thin optically transmissive layers 52, 54 to form a color filter in transmission mode, also known as a dichroic filter or thin film filter. The filter can be provided on a substrate (such as substrate 30 in FIG. 7), or can be encapsulated between further top and bottom layers (not shown), such as $SiO_2$. The phase change material layer 50 can be switched between states to provide a color contrast. The switching is done thermally by locally heating the material; the heating can be done electrically or optically (e.g. IR illumination). In one version, patterned or pixellated electrodes allow electrical contact to one or more of the layers to enable the heating and switching. As shown in FIG. 10(a), this can be done by applying a voltage across the upper and lower layers 52, 54, to pass a current vertically through the layer 50 to cause ohmic heating. Alternatively, as shown in FIG. 10(b), the current can be passed laterally through the layer 50. The heating can be done by providing a heater adjacent to the phase change material layer 50. The heater can be a transparent conductive layer 56, such as ITO, provided on either or both surfaces of the layered structure, as shown in FIGS. 10(c), 10(d) and 10(e). The illustrations of FIG. 10 are merely schematic and show only a single switchable pixel; a practical display could have millions of pixels. As well as semi-transparent displays with color, the device could be used as a tuneable filter for optoelectronic devices (e.g. LCDs), or for smart jewellery or decorative items, such as tiles, or other art.

In the preferred embodiments of FIG. 10, the phase change material layer 50 is vanadium dioxide ($VO_2$) or more generally $VO_x$ (depending on stoichiometry), and the sandwiching layers 52, 54 are silver (Ag) or any transparent or semitransparent layer. The $VO_2$ is monostable in nature: at temperatures below 65 C it is in a first crystalline state (monoclinic); when heated above 65 C it transitions to a second crystalline state (rutile), but it reverts back to the first state as soon as the heat source is removed. Large color contrast between the two states can be achieved with a range of thicknesses of the layers. For example, the $VO_x$ can be in the range of from 20 to 40 nm thick, and each Ag layer can be in the range of from 8 to 10 nm thick.

$VO_x$ compounds are merely one example of suitable phase change materials for these further embodiments. Any of the so-called "Mott memristors" (materials that undergo a metal-to-insulator transition, MIT, at some specific temperature) are suitable, for example $NbO_x$. These compounds can, of course, be used in any of the earlier embodiments described herein, from FIG. 1 onwards.

Figure 11:
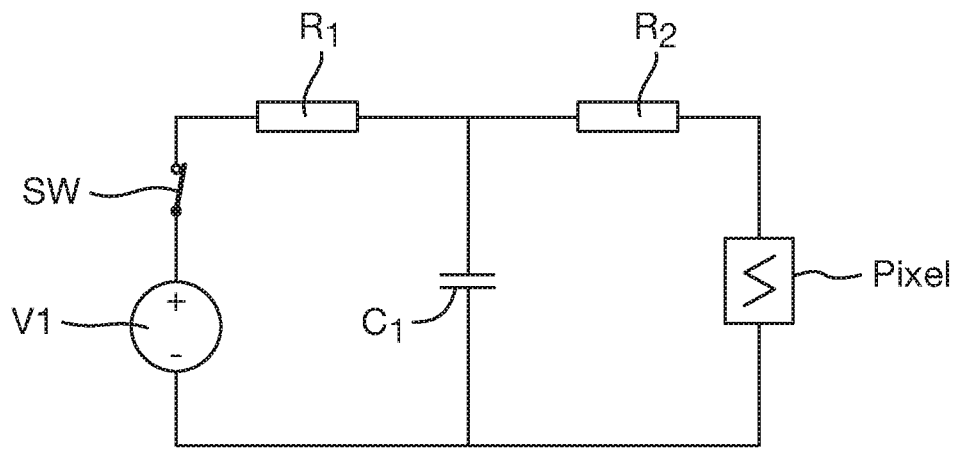
FIG. 11 illustrates one embodiment of a driving circuit for a pixel of a display.

Drive circuitry is required to control the switching of each of the pixels composed of a monostable material (such as $VO_2$ described above). The phase change is temperature dependent, but it is impractical to provide a thermocouple and temperature control feedback system for each pixel; however, it is also important to finely control the current supplied, to prevent overheating and unnecessary power consumption. One suitable form of drive circuit is a self-oscillating circuit, such as a Pearson-Anson oscillator, as illustrated in FIG. 11. This requires very few components and can provide passive control for each pixel. When a pixel is switched 'on' (drive voltage applied from dc source V1 by switch SW), the time-constant of the oscillation (set by a resistor R1 and capacitor C1) can have a frequency of MHz, so is perceived as continuously on by a human observer. The resistor R1 value also controls the duty cycle of the oscillations, and a further resistor R2 in series with the phase change material of the pixel sets the maximum current. So by changing the values of these resistors R1, R2, the perceived brightness and color of a switched pixel can be readily changed, ensuring an effectively self-controlled grey-scale modulation over a nano-scale pixel.

A further variant on any of the preceding embodiments is include a liquid crystal transmissive display (not shown) at either the front or back surface of the layered display structure. The liquid crystal display can be used to provide extra control over the polarization of light entering and/or leaving the display device.

Display devices embodying the invention can be produced that have low power consumption, but provide a high-resolution, color display (the resolution is only limited by lithographic techniques). The display devices can switch at high speed, so can show video, and have a wide viewing angle. The devices can be fabricated using standard techniques, and can be made very thin, and also flexible if desired.

Figure 12:
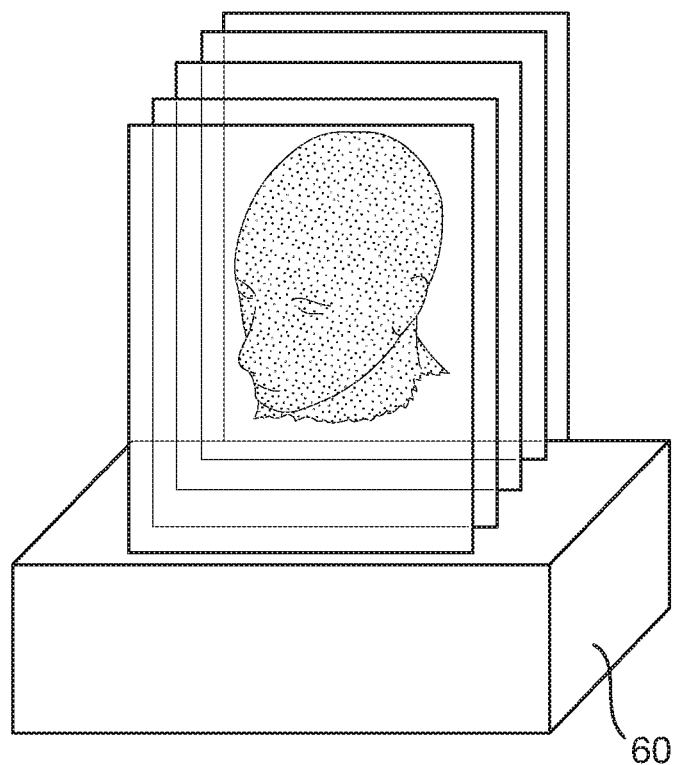
FIG. 12 shows an example of a 3D display according to an embodiment of the invention.

The preceding embodiments of the invention provide a two-dimensional (2D) display. Although, the display panel can be flexible and/or can be provided on a curved surface, it is still basically 2D. However, it can be desirable to provide a display such that items can be visualized in three-dimensions (3D). As previously mentioned, the arrangement of FIG. 7 or FIG. 10 provides a transmissive display. By providing several such transmissive 2D display panels parallel to each other and in a stack, preferably spaced apart from each other, as illustrated in FIG. 12, one can render 3D images of objects. The control box 60 addresses each 2D display panel and provides each panel with image data for a slice of the object. The images can be changed in real time such that a 3D movie can be displayed.

The 3D display of this embodiment is especially suited for use in any field that uses tomography, such as is common in medical imaging, because the data is intrinsically obtained as slices of the object being imaged. The control box 60 provides each 2D display panel with the image data for a respective slice of the object, and the user can move around the 3D display to view the object from different angles.

The invention claimed is:

1. A display device comprising:
   a plurality of electrodes;
   a portion of solid state material, wherein said material is a phase change material having a refractive index that is reversibly controllable by application of a voltage to said electrodes; and
   a controller adapted to apply at least one voltage, via said electrodes, to change said refractive index of said material, wherein;
   the display device has a viewing surface and further comprises a spacer layer, which is transmissive to light, provided on the opposite side of said portion of solid state material from said viewing surface; and either;
   the display device further comprises a reflector, wherein the spacer layer is provided between the reflector and said portion of solid state material, or
   the display device further comprises a transparent or at least partially transmissive substrate and the spacer layer is provided between the transparent or at least partially transmissive substrate and said portion of solid state material.

2. The display device according to claim 1, wherein the material is electrically contacted by at least two of said electrodes, and the controller is adapted to stop applying any voltage to the material after the refractive index has been changed to a selected value.

3. The display device according to claim 1, wherein the material comprises a compound or alloy of a combination of elements selected from the following list of combinations: GeSbTe, $VO_x$, $NbO_x$, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

4. The display device according to claim 3, wherein the material comprises a mixture of compounds or alloys of combinations of elements from said list.

5. The display device according to claim 4, wherein said material further comprises at least one dopant.

6. The display device according to claim 1, wherein the material comprises $Ge_2Sb_2Te_5$.

7. The display device according to claim 1, wherein the portion of material is less than 100 nm thick.

8. The display device according to claim 7, wherein the portion of material is less than 10 nm thick.

9. The display device according to claim 1, wherein at least one of said electrodes is transmissive to light.

10. The display device according to claim 1, wherein at least one of said electrodes comprises indium tin oxide or silver.

11. The display device according to claim 1, wherein said spacer layer has a thickness in the range of from 10 nm to 250 nm.

12. The display device according to claim 1, wherein said spacer layer comprises one of said electrodes.

13. The display device according to claim 1, having a viewing surface and a light source arranged for illuminating the portion of material on the opposite side from said viewing surface.

14. The display device according to claim 1, wherein said electrodes are arranged to passing current through said material and/or to passing current through a heater adjacent to said material, to control the refractive index of the material.

15. The display device according to claim 1, comprising a plurality of said portions of solid state material arranged in an array, wherein the refractive index of each portion of material is separately controllable.

16. A 3D display comprising a plurality of display devices according to claim 15, wherein each display device comprises a 2D array, and the display devices are arranged parallel to each other and displaced perpendicular to their 2D array.

* * * * *